United States Patent
Saulnier et al.

(10) Patent No.: US 6,756,798 B2
(45) Date of Patent: Jun. 29, 2004

(54) CONTACTOR ASSEMBLY FOR TESTING CERAMIC SURFACE MOUNT DEVICES AND OTHER ELECTRONIC COMPONENTS

(75) Inventors: Christian R. Saulnier, Boutigny (FR); James G. Gasque, Vista, CA (US); Manuel A. Gallardo, Carnetin (FR)

(73) Assignee: Ceramic Component Technologies, Inc., Vista, CA (US)

( * ) Notice: Subject to any disclaimer, the term of this patent is extended or adjusted under 35 U.S.C. 154(b) by 150 days.

(21) Appl. No.: 10/097,464

(22) Filed: Mar. 14, 2002

(65) Prior Publication Data

US 2003/0173986 A1 Sep. 18, 2003

(51) Int. Cl.[7] .............................................. G01R 31/02
(52) U.S. Cl. ...................... 324/754; 324/158.1; 324/757
(58) Field of Search ................................ 324/754, 755, 324/765, 158.1, 437, 757, 758, 690, 696; 439/72, 73, 331

(56) References Cited

U.S. PATENT DOCUMENTS

| | | | |
|---|---|---|---|
| 4,395,184 A | | 7/1983 | Braden |
| 4,669,416 A | | 6/1987 | Delgado et al. |
| 6,019,612 A | * | 2/2000 | Hasegawa et al. ............ 439/73 |
| 6,069,480 A | | 5/2000 | Sabounchi et al. |
| 6,093,030 A | * | 7/2000 | Riechelmann et al. ........ 439/72 |
| 6,194,679 B1 | | 2/2001 | Garcia et al. |
| 6,204,464 B1 | | 3/2001 | Garcia et al. |
| 6,294,747 B1 | | 9/2001 | Liu et al. |

* cited by examiner

Primary Examiner—Kamand Cuneo
Assistant Examiner—Trung Q. Nguyen
(74) Attorney, Agent, or Firm—Loyal McKinley Hanson

(57) ABSTRACT

A contactor assembly useable on a component testing system for electrically contacting a terminal on a device under test (DUT) for parametric testing and eventual sorting as part of component batch processing. At least three contacts are provided to help insure at least two of them contact the DUT terminal, each of the contacts having a forward edge for physically and electrically contacting the DUT terminal. A contact-holding structure mountable on the component testing system supports the contacts in side-by-side relationship for independent movement of the first, second, and third forward edges toward and away from the DUT terminal. A first spring bias the first and third forward edges toward the DUT terminal independently of the second forward edge while a second spring biases the second forward edge toward the DUT terminal independently of the first and third edges in order to thereby help insure that at least two forward edges of the contacts bear against the DUT terminal for decreased stray serial impedance (SSI). One four-spring, twelve-blade embodiment of a multi-contact, constant-force contact assembly constructed according to the invention includes blade-type contacts separated by insulators that enable holding at least one blade at a guard potential. Roller contacts and pogo pin contacts fall within the scope of the invention.

12 Claims, 12 Drawing Sheets

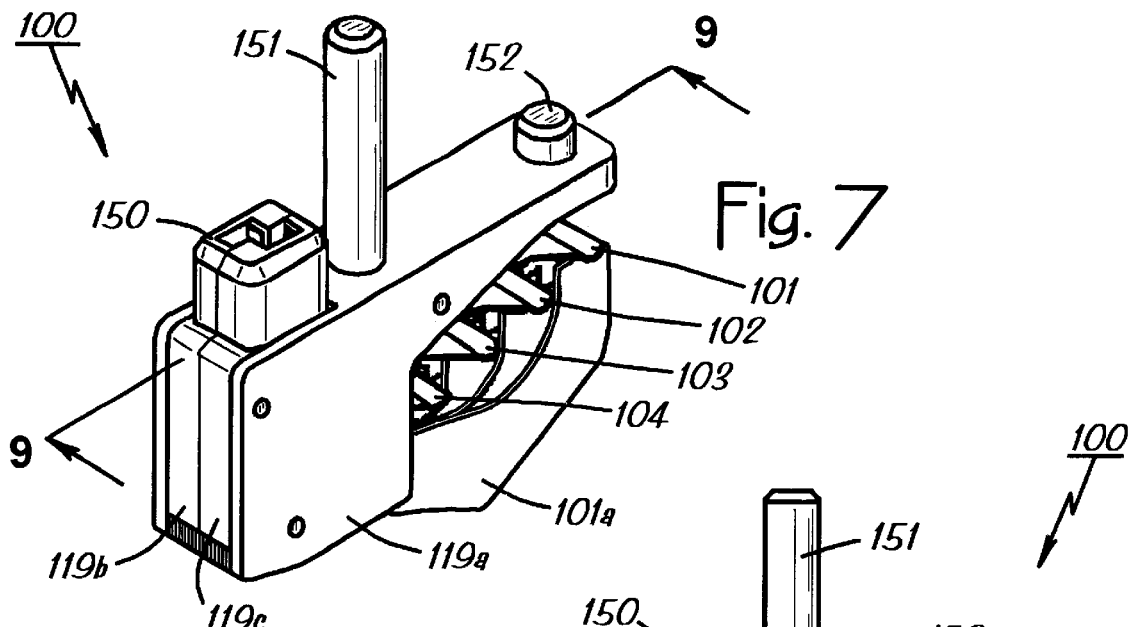
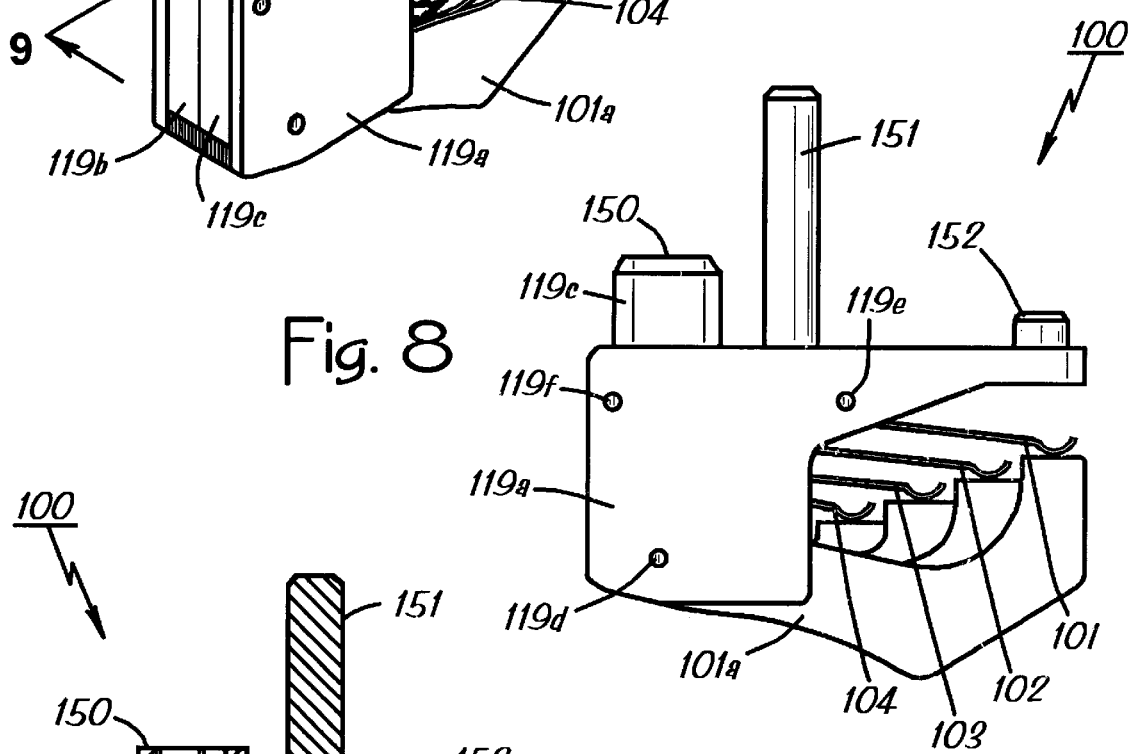
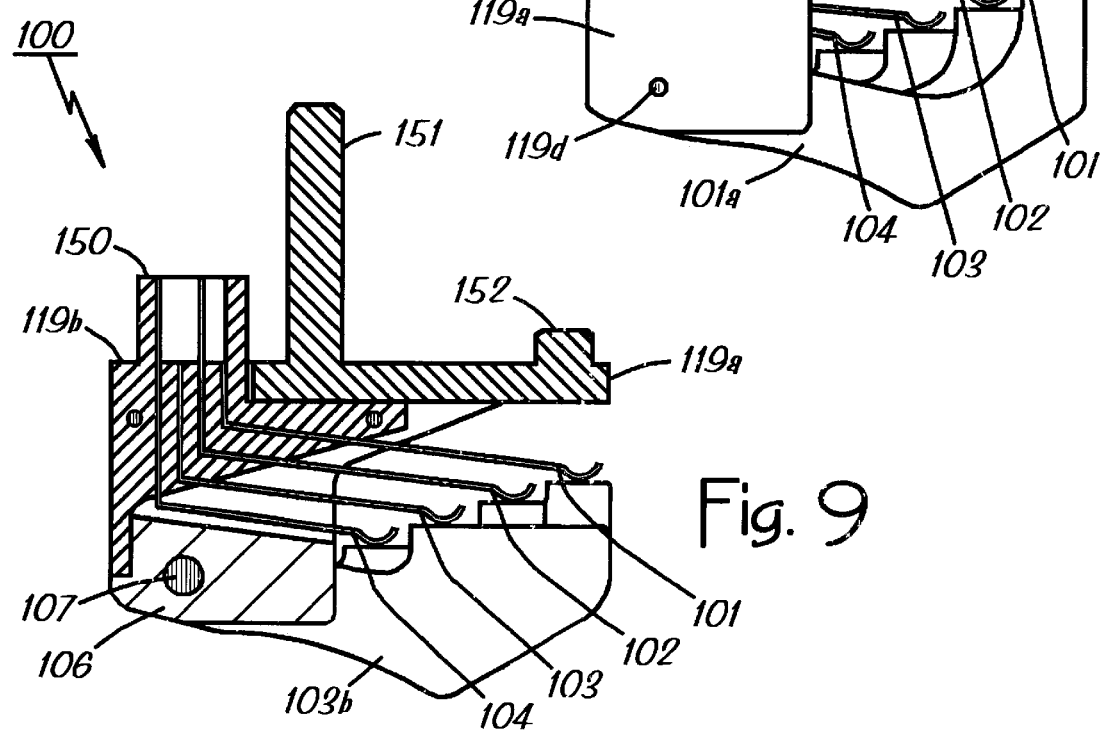

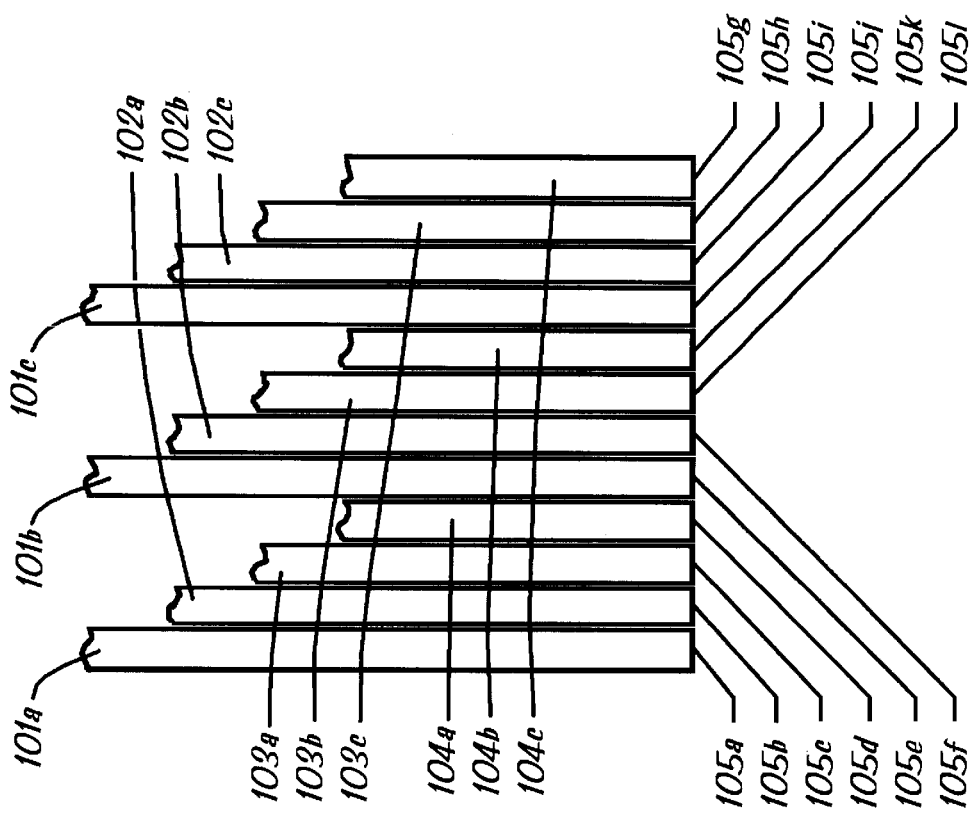
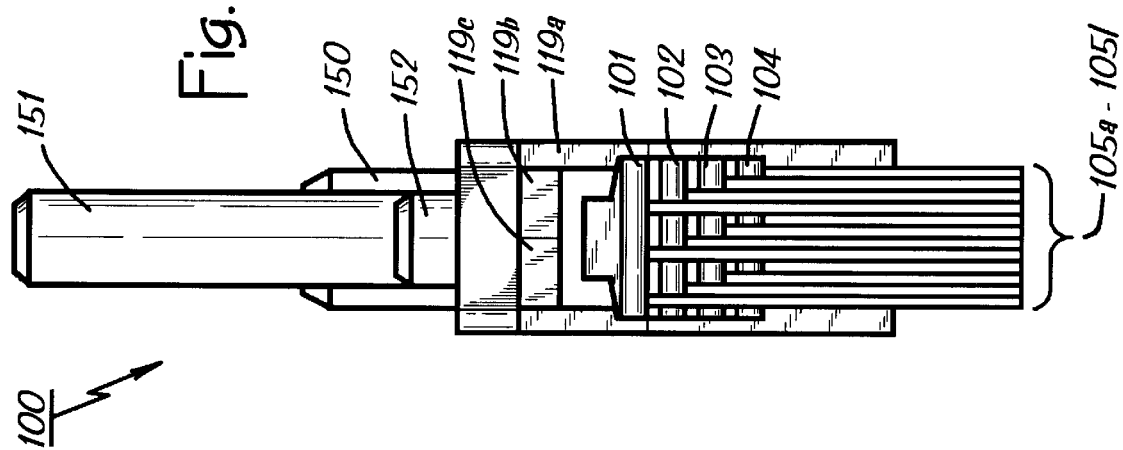

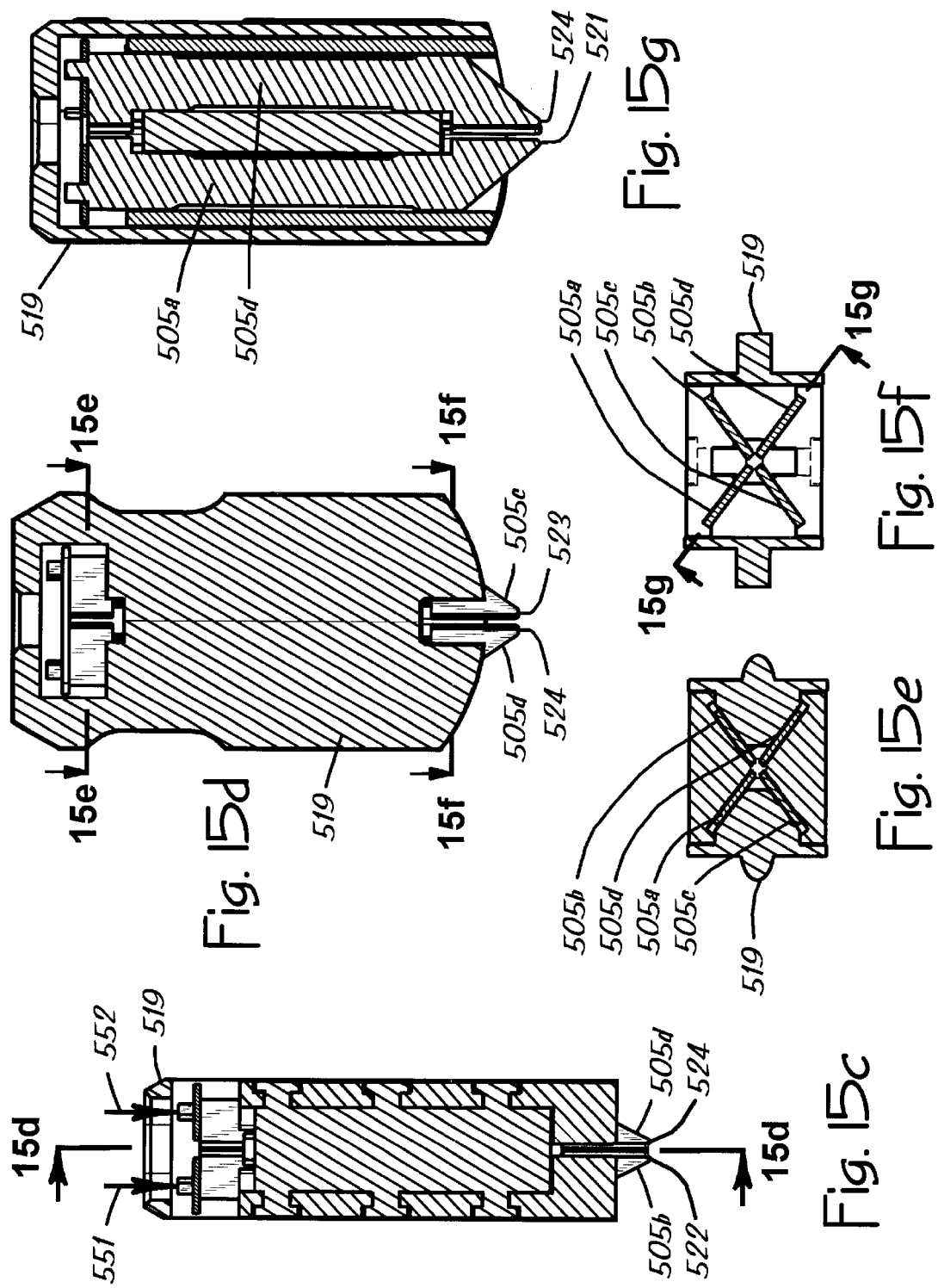

CONTACTOR ASSEMBLY FOR TESTING CERAMIC SURFACE MOUNT DEVICES AND OTHER ELECTRONIC COMPONENTS

BACKGROUND OF THE INVENTION

1. Technical Field

This invention relates generally to the batch processing of miniature electronic circuit components, including passive, two-terminal, ceramic capacitors, resistors, inductors, and the like. More particularly, it concerns a contactor assembly for electrically contacting a terminal on such a component or other device under test (DUT) as part of the batch processing for purposes of parametric testing.

2. Description of Related Art

The tiny size of electronic circuit components of interest herein complicates processing. Typically fabricated in parallelepiped shapes having dimensions as small as 0.020"by 0.010"by 0.010,"more or less, these difficult-to-handle components require appropriate equipment and precision handling techniques. What is sometimes referred to as a "carrier plate" holds many hundreds of the components upright in spaced-apart positions as the ends of each component are coated with a conductive material to produce electrical terminals. After adding terminals, a "test plate" holds the large batch of components for movement past a contactor assembly of a testing system for parametric testing purposes and eventual sorting. Thoughtful design of each of these components promotes efficient processing. Reference may be made to U.S. Pat. Nos. 6,204,464; 6,294,747; 6,194,679; 6,069,480; 4,395,184; and 4,669,416 for examples of some prior art component handling systems and testing techniques.

The contactor assembly is of particular interest. It is a device having an electrical contact that touches the DUT terminal as the test plate moves the DUT past the contactor assembly. It does so to complete an electrical testing circuit. One problem is that touching the DUT terminal improperly can physically damage the terminal. It can also produce a poor electrical contact that degrades test results.

Existing production testers often use "sliding contacts" and/or "rolling contacts" to perform the electrical and mechanical functions mentioned above. Electrically, the contacts should couple a test signal between testing components and the DUT terminal in a manner providing a sufficiently accurate electrical test. Mechanically, the contacts should press the contact against the DUT terminal with enough force to attain a good electrical contact despite the usual presence of a non-conductive oxide layer on the surface of the DUT terminal. Sufficient force causes the contact (e.g., a sliding leaf spring type of contact) to advance through the oxide layer to the underlying conductive material of the DUT terminal, and that reduces electrical resistance between the contact and the DUT terminal.

The problem is that forcing the contact against the DUT terminal can leave a mark or scratch on the surface of the DUT terminal. End users of the component often consider such scratches to be defects. Failure to achieve a good electrical contact, on the other hand, degrades test results. The electrical and mechanical functions are conflicting in those respects and existing contactor assembly designs exhibit varying degrees of success in alleviating the conflict. Thus, manufacturers engaged in batch processing of miniature electronic circuit components seek improvement in contactor assembly design and so a need exists for a better contactor assembly.

SUMMARY OF THE INVENTION

This invention addresses the concerns outlined above by providing a contactor assembly having at least three independently moveable contacts in side-by-side relationship that are spring biased toward the DUT terminal. Three contacts help insure that at least two of them contact the DUT terminal for lower serial impedance in series with the effective serial resistance (ESR) of the DUT. A preferred embodiment accomplishes spring biasing with constant force over a normal range of travel (e.g., one to three millimeters) to alleviate scratching concerns.

The illustrated embodiments achieve the foregoing and much more. Sliding contacts in the form of thin side-by-side blades having forward edges disposed toward the DUT terminal further facilitate multiple contacts. Insulation between contacts isolates the contacts from each other to enable Kelvin measurement techniques. An intermediate one of the three contacts may be held at a guard potential in order to help balance leakage currents, and the number of blades can be increased beyond three so that they can better conform to the shape of the DUT terminal. This "multipoint" technology reduces or eliminates the serial stray impedances with the DUT, while the "guarding" technology reduces or eliminates the effects of parallel stray impedances with the DUT. Multipoint technology works well for very low impedances. Guarding technology works well for very high impedances To paraphrase some of the more precise language appearing in the claims, the invention provides a contactor assembly useable on a component testing system for electrically contacting a terminal on a DUT. That is done as the component testing system moves the DUT past the contactor assembly for parametric testing and eventual sorting as part of component batch processing. The contactor assembly includes at least three contacts that are referred to herein as first, second, and third contacts (i.e., three or more contacts). Each of the contacts having a respective one of first, second, and third forward edges for physically and electrically contacting the DUT terminal as the DUT moves past the contactor assembly. Three or more contacts help insure that at least two forward edges contact the DUT terminal for decreasing or eliminating the stray serial impedance (SSI) in series with the effective serial resistance (ESR) of the DUT.

A contact-holding structure mountable on the component testing system supports the contacts in side-by-side relationship for independent movement of the first, second, and third forward edges toward and away from the DUT terminal. A first spring bias the first and third forward edges toward the DUT terminal independently of the second forward edge, while a second spring biases the second forward edge toward the DUT terminal independently of the first and third edges, That arrangement helps further insure that at least two forward edges of the contacts bear against the DUT terminal for decreased SSI.

Thus, the invention alleviates problems of existing contactor assemblies. Direct replacement of an existing contactor assembly with a multi-contact, constant-force contact assembly constructed according to the invention significantly improves performance. One four-spring, twelve-blade embodiment of a multi-contact, constant-force contact assembly constructed according to the invention includes blade-type contacts separated by insulators. Roller contacts and pogo pin contacts fall within the scope of the invention. The following illustrative drawings and detailed description make the foregoing and other objects, features, and advantages of the invention more apparent.

BRIEF DESCRIPTION OF THE DRAWINGS

FIG. 7 is an isometric view of a four-spring, twelve-blade, second embodiment of a contactor assembly constructed according to the invention;

FIG. 8 is a side elevation view of the second embodiment;

FIG. 9 is a cross sectional view of the second embodiment as viewed in a vertical plane containing a line 9—9 in FIG. 7;

FIG. 10 is an enlarged front elevation view of the second embodiment;

FIG. 11 is a further enlarged front elevation view of the second embodiment showing a portion of the twelve blades;

FIG. 14a is a side elevation view of a roller-type fifth embodiment of a contactor assembly constructed according to the invention;

FIG. 14b is a cross sectional view of the roller-type fifth embodiment as viewed in a vertical plane containing a line 14b—14b in FIG. 14a;

FIG. 14c is a cross sectional view of the roller-type fifth embodiment as viewed in vertical planes containing a segmented line 14c—14c in FIG. 14a;

FIG. 15c is a cross sectional view of the pogo-pin sixth embodiment as viewed in a vertical plane containing a line 15c—15c in FIG. 15b;

FIG. 15d is a cross sectional view of the pogo-pin sixth embodiment as viewed in a vertical plane containing a line 15d—15d in FIG. 15c;

FIG. 15e is a cross sectional view of the pogo-pin sixth embodiment as viewed in a horizontal plane containing a line 15e—15e in FIG. 15d;

FIG. 15f is a cross sectional view of the pogo-pin-type sixth embodiment as viewed in a horizontal plane containing a line 15f—15f in FIG. 15d; and FIG. 15g is a cross sectional view of the pogo-pin type sixth embodiment as viewed in a vertical plane containing a line 15g—15g in FIG. 15f.

DESCRIPTION OF THE PREFERRED EMBODIMENTS

FIGS. 1–4 of the drawings show various aspects of a contactor assembly 10 constructed according to the invention to have three or more contacts in order to insure that at least two of them contact a terminal on a device under test (DUT). The contactor assembly 10 includes eight contacts. They are sliding contacts in the form of narrow, electrically conductive blades 11–18 (e.g., metal) held by a contact-holding structure 19 (e.g., nonconductive plastic). All eight of the blades 11–18 are designated in FIGS. 3 and 4, while just two of the eight blade contacts are designated in FIG. 1 and two in FIG. 2. Although the illustrated contact-holding structure 19 is composed of an electrically nonconductive material, it may be composed of an electrically conductive material within the broader inventive concepts disclosed and it is intended that the drawings cover that alternative also. When composed of an electrically conductive material, it may be held at a guard potential or a ground potential, for example.

Figure 1:
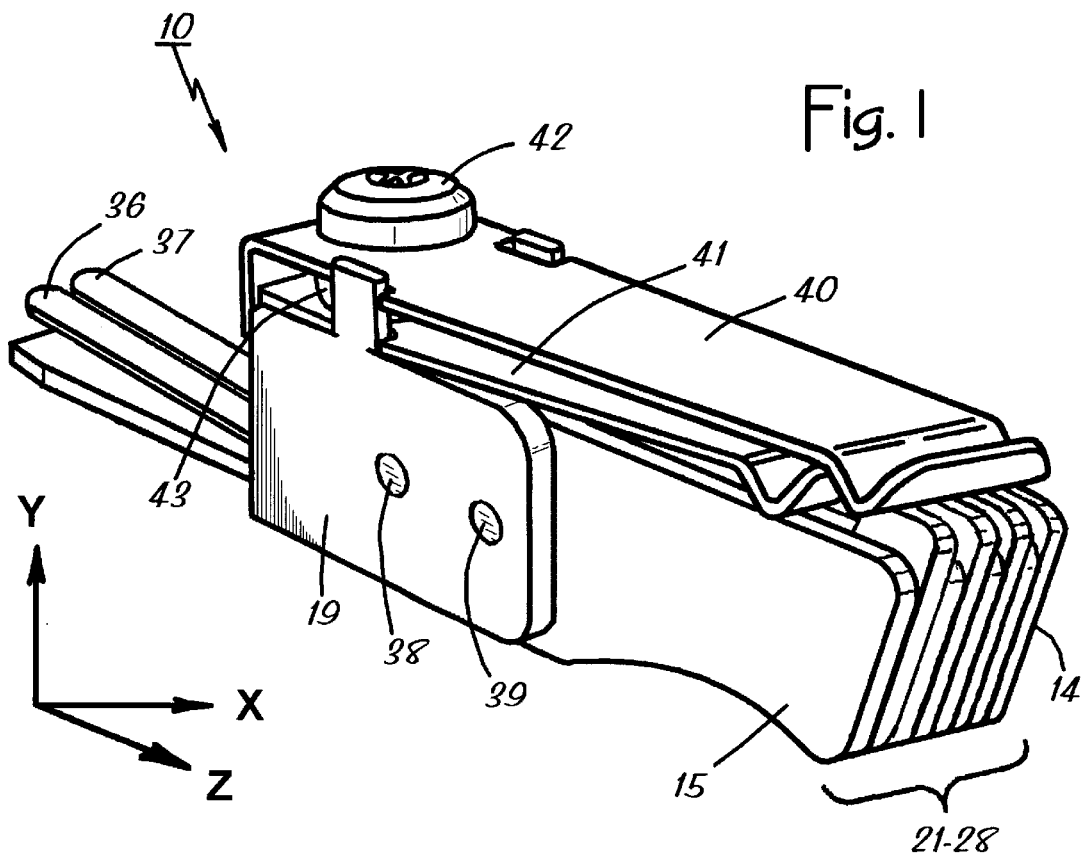
FIG. 1 of the drawings is an isometric view of a two-spring, eight-blade, first embodiment of a multi-contact, constant-force contactor assembly constructed according to the invention, with an X-Y-Z Cartesian coordinated system illustrated for use in describing the contactor assembly.
Figure 2:
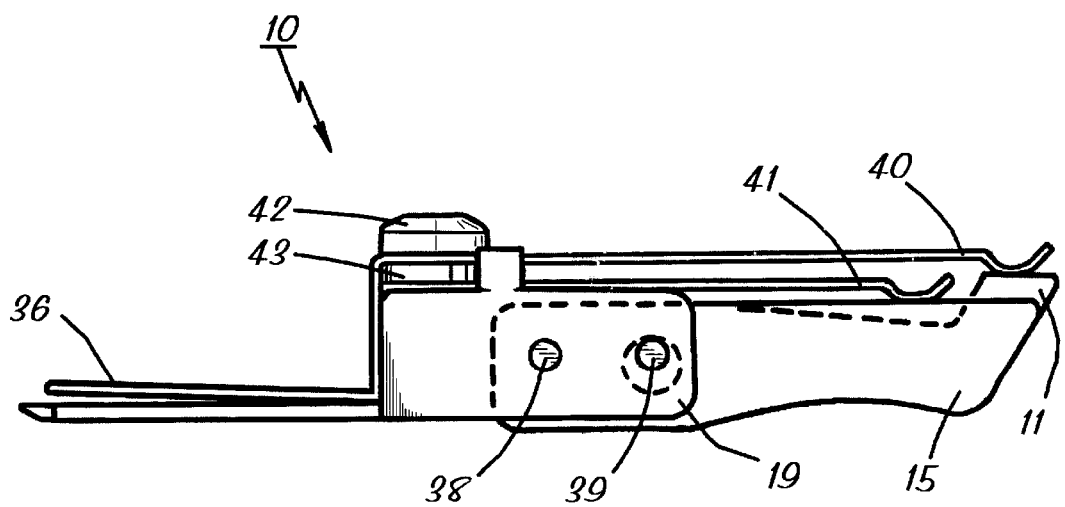
FIG. 2 is a side elevation view of the first embodiment.
Figure 3:
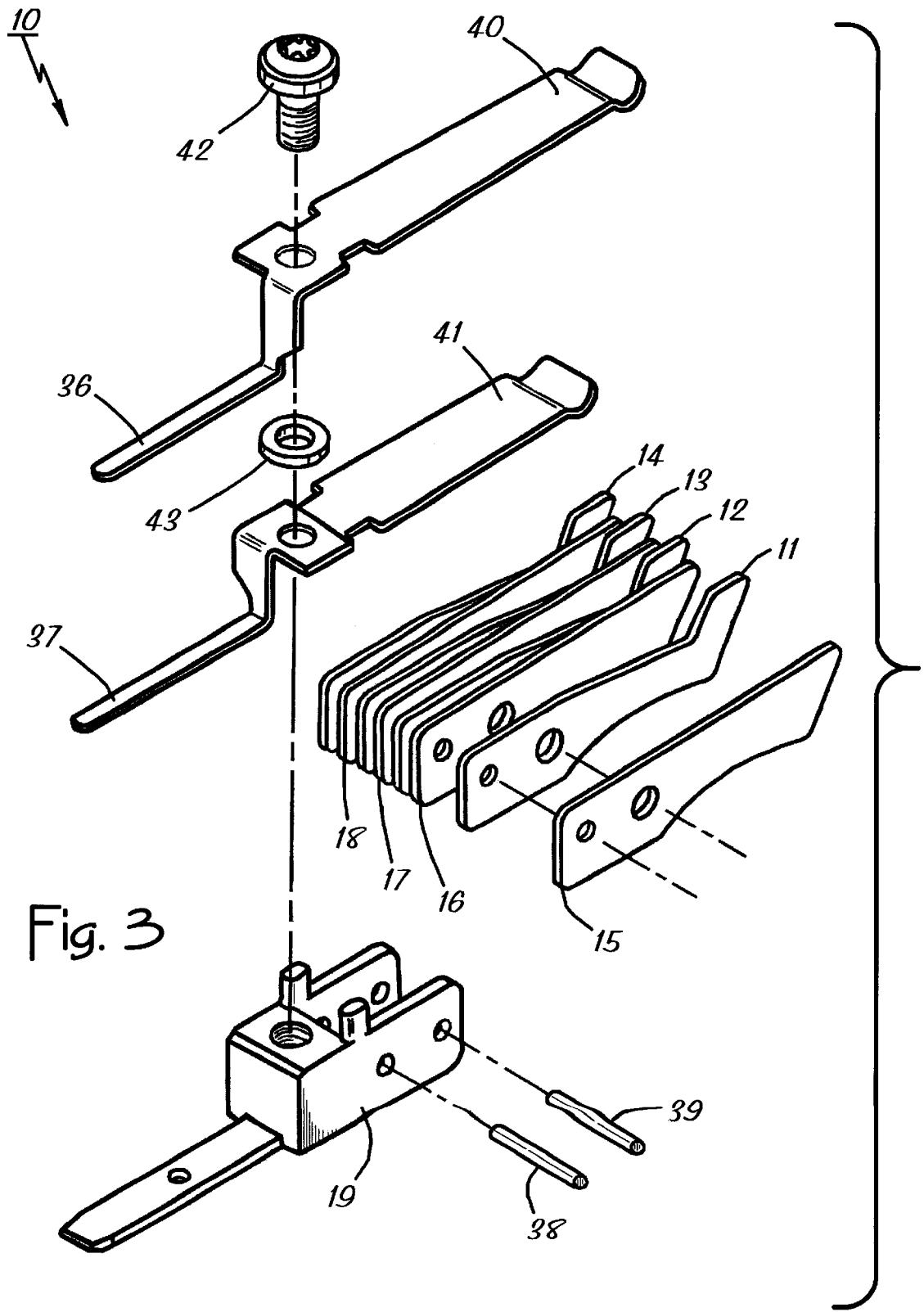
FIG. 3 is an exploded view of the first embodiment.
Figure 4:
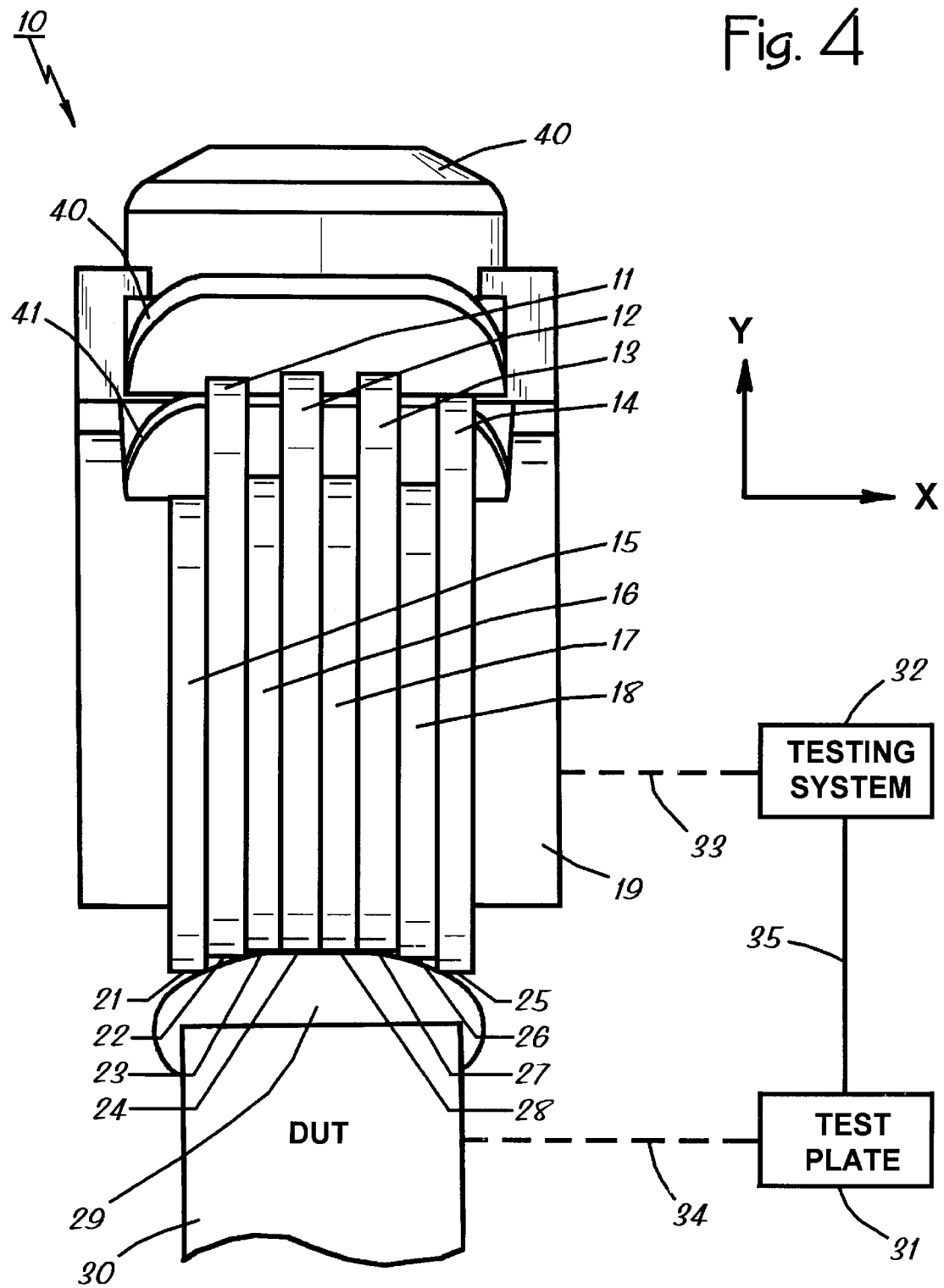
FIG. 4 is an enlarged front elevation view of the first embodiment showing the testing system, test plate, and DUT diagrammatically with the contact blades contacting the terminal on the DUT.

Each of the blades 11–18 has a respective one of forward edges 21–28 (designated in FIGS. 1 and 4). The forward edges 21–28 serve to physically and electrically contact a terminal 29 on a DUT 30 as illustrated in FIG. 4. That occurs when a test plate component 31 of a testing system 32 (shown diagrammatically in FIG. 4) moves the DUT 30 past the contactor assembly 10. The dashed line 33 in FIG. 4 diagrammatically indicates physical and electrical connection of the contactor assembly 10 to the testing system 32, while the dashed line 34 indicates physical holding and movement of the DUT 30 past the contactor assembly 10 by the test plate 31 in a known way, and the solid line 35 indicates that the test plate 31 is part of the testing system 32. The contact-holding structure 19 mounts on the testing system 32 as means for supporting the blades 11–18 on the component testing system 32 while first and second terminals 36 and 37 (FIGS. 1–3) electrically connect the blades 11–18 to the testing system 32.

The eight blades 11–18 include four larger blades 11–14 interleaved in close side-by-side relationship with four smaller blades 15–18 as illustrated. They are held in that relationship by the blade-holding structure 19 and pins 38 and 39 That arrangement results in an overall width of the blades 11–18 (measured parallel to the X axis) comparable to the width of the terminal 29 (e.g., 1.0 to 5.0 millimeters overall blade width for a DUT terminal width of that size), and that helps insure multiple contact of the terminal 29 during testing by the forward edges of at least two blades. In addition, the blades 11–18 are supported moveably on the contact-holding structure 19 in side-by-side relationship for independent movement toward and away from the terminal 29 on the DUT 30 as the DUT 30 moves past the contactor assembly 10 (e.g., they pivot slightly about the pin 38). The blades 11–18 move independently parallel to the Y axis and that helps them conform to the shape of the terminal 31. They typically travel about one to three millimeters in the Y direction to accommodate the variations in shape of a typical DUT terminal and that amount is referred to herein as a normal range of travel.

The contactor assembly 10 includes first and second leaf springs 40 and 41 held in insulated relationship on the contact-support structure 19 with a nonconductive screw 42 (e.g., plastic) and a nonconductive washer 43. The first and second springs 40 and 41 serve as means for spring biasing the forward edges 21–28 toward the DUT terminal 29. The first spring 40 bears against the larger blades 11–14 and thereby spring biases the forward edges 22, 24, 26, and 28 of the larger blades 11–14 toward the DUT terminal 29 independent of the forward edges 21, 23, 25, and 27. Similarly, the second spring bears the smaller blades 15–18 and thereby spring biases the forward edges 21, 23, 25, and 27 of the smaller blades 15–18 toward the DUT terminal 29 independent of the forward edges 22, 24, 26, and 28. For the one to three millimeter normal range of travel mentioned above, the first and second leaf springs 40 and 41 move only slightly along a short arc compared to their lengths (e.g., 20 to 25 millimeters measured to the screw 42 parallel to the Z axis) and so they may be said to exert a relatively constant force against the blades 11–18 (e.g., the force against the blades varies less than ten percent of its maximum value over the range of travel).

Figure 5:
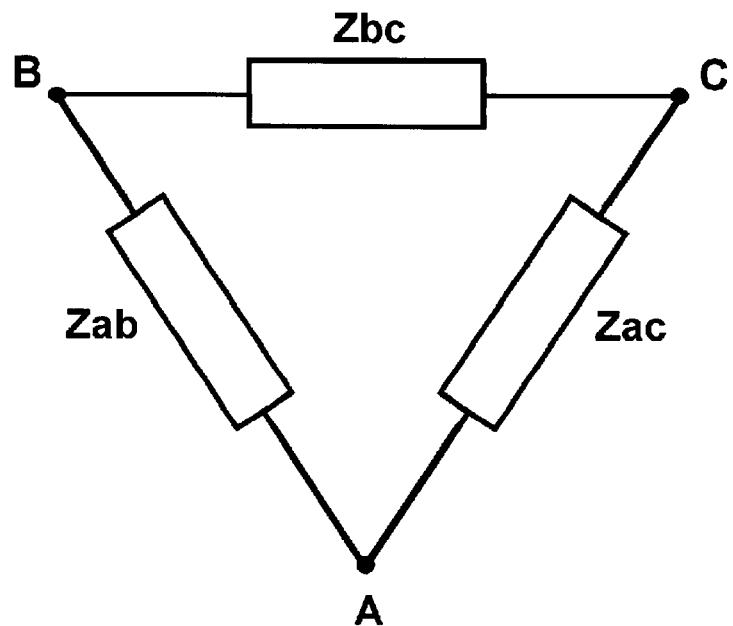
FIG. 5 is a block circuit diagram showing the contact-to-terminal impedances of two adjacent contacts contacting the DUT terminal, along with the contact-to-contact impedance.
Figure 6:
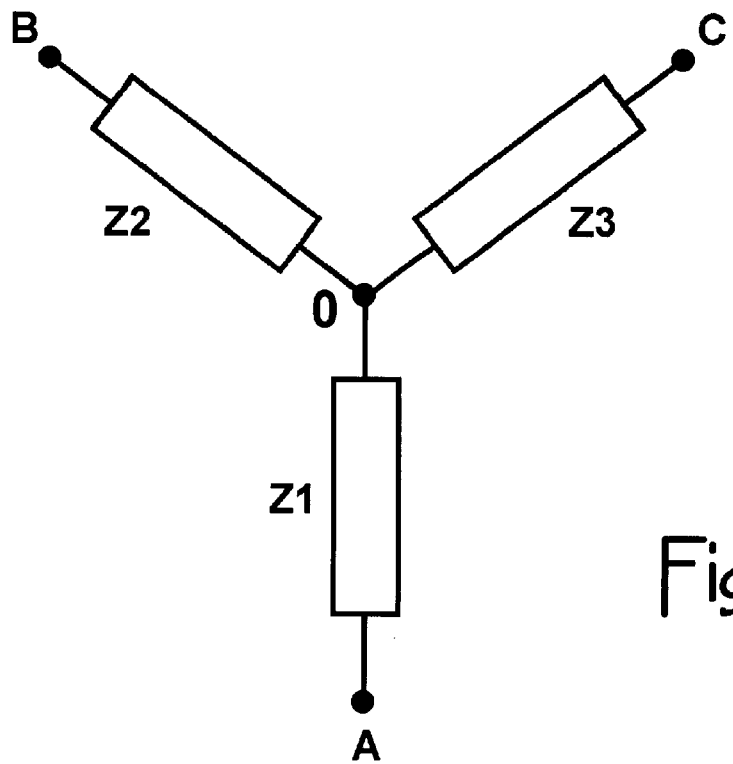
FIG. 6 is a transformed block circuit diagram derived from the block circuit diagram in FIG. 5 that shows the stray effective serial impedance (SSI) between a theoretical measurement definition point and the two adjacent contacts and the DUT terminal.

Well-known circuit theory explains the decreased SSI achieved by the contactor assembly 10. Point A in FIGS. 5 and 6 represents the DUT terminal 29. Point B represents the forward edge 24 of the blade 12 (i.e., a first one of two adjacent contacts), and point C represents the forward edge 28 of the blade 17 (i.e., a second one of two adjacent contacts). Zab in FIG. 5 represents the serial resistance between the forward edge 24 and the DUT terminal 29, while Zac in FIG. 5 represents the serial resistance between the forward edge 28 and the DUT terminal 29. Zbc represents the impedance between the two forward edges 24 and 28 (e.g., impedance between the two adjacent blades 12 and 17).

The stray serial impedance (SSI) is determined by performing an impedance transformation from FIG. 5 to FIG. 6. The SSI (Z1) defined between point 0 (a theoretical measurement definition point) and point A (the surface of the DUT terminal) is calculated from contact impedances Zab and Zac and the impedance Zbc between point B (the first blade 12) and point C (the second blade 17). Zbc can be variable or a constant value between the blades, such as a 10 Ohm resistor. The value Z1, for example, is calculated as follows:

$$Z1 = \frac{Zab \times Zac}{Zab + Zac + Zbc} \quad \text{Equation 1}$$

Impedance values for the reverse transformation from FIG. 6 to FIG. 5 are calculated as follows:

$$Zab = Z1 + Z2 + \frac{Z1 \times Z2}{Z3} \quad \text{Equation 2}$$

The foregoing considerations show that the stray serial impedance (SSI) for the contactor assembly 10 is significantly less, and measurement verifies that to be true.

Next consider FIGS. 7–11. They show various aspects of a second embodiment of the invention in the form of a four-spring, twelve-blade, contactor assembly 100. The contactor assembly 100 is similar in some respects to the contactor assembly 10 and so only differences are described in further detail. For convenience, reference numerals designating parts of the contactor assembly 100 are increased by one hundred over those designating similar or related parts of the contactor assembly 10.

Similar to the contactor assembly 10, the contactor assembly 100 includes a contact-holding structure for holding a plurality of at least three contacts on the testing system 32 shown in FIG. 4. However, the contact-holding structure is configured differently and it holds twelve blades to further help insure good contact with the DUT terminal 29. The contact-holding structure includes a first section 119a identified in FIGS. 7–10 that assembles together with a second section 119b identified in FIGS. 7, 9, and 10, and a third section 119c identified in FIGS. 7, 8, and 10 using first, second, and third pins 119d, 119e, and 119f identified in FIG. 8. When assembled together, the second and third sections 119b and 119c hold four springs 101, 102, 103, and 104 between them (FIGS. 7–10) so that the four springs 101–104 bear against the twelve blades 101a–c, 102a–c, 103a–c, and 104a–c. Just the blade 101a is identified in FIGS. 7 and 8, just the blade 103b is identified in FIG. 9, and all twelve blades are identified in FIG. 11. The forward edges 105a–105l are identified in FIGS. 10 and 11. They bear against the DUT terminal 29 in FIG. 4 as the blades pivot about a nonconductive sleeve 107 (FIG. 9) disposed over the pin 119d in order to accommodate variances in the shape of the DUT terminal 29.

The contactor assembly 100 includes insulator members intermediate adjacent ones of the twelve blades and between the outermost blades and the first section 119a of the contact-holding structure. Just one of the insulator members (insulator member 106) is visible in FIG. 9. Of course, insulation can be provided instead by a nonconductive coating on some or all of the blades, just so long as the forward edges 105a–105l of the blades are exposed so they can electrically contact the DUT terminal. In addition to the foregoing, the second and third sections 119b and 119c combine to form a female connector 150 (FIGS. 7–10) for use in electrically connecting the four springs 101–104 (and thereby the twelve blades) to the testing system 32 shown in FIG. 4, while the first section 119a includes protrusions 151 and 152 that serve to properly aligned the contactor assembly 100 when it is mounted on the testing system 32.

Figure 12:
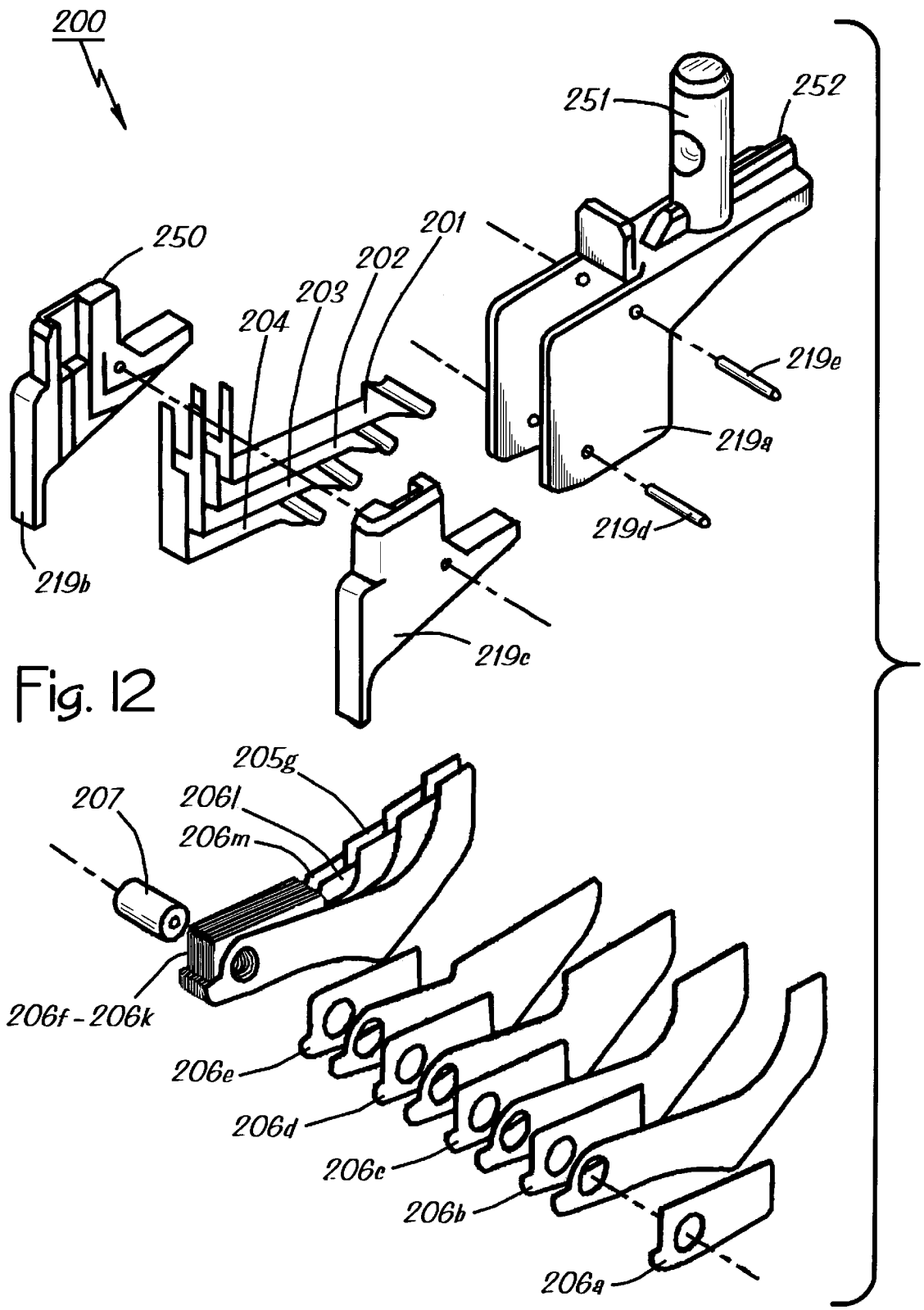
FIG. 12 is an exploded view of a four-spring, twelve-blade, third embodiment having a slightly different contact-holding structure, with the exploded view showing more of the assembly details and exposing more of the insulators intermediate the blades.

Now consider FIG. 12. It shows a third embodiment in the form of a four-spring, twelve-blade, contactor assembly 200. The contactor assembly 200 is similar in structure and function to the contactor assembly 100, having a slightly different contact-holding structure. Also, FIG. 12 helps further illustrate the relationship of parts for the contactor assembly 100 described above. For convenience, reference numerals designating parts of the contactor assembly 200 are increased by one hundred over those designating similar or related parts of the contactor assembly 100.

Similar to the contactor assembly 100, the contactor assembly 200 includes a contact-holding structure for holding a plurality of at least three contacts (twelve blade-type contacts) on the testing system 32 shown in FIG. 4. The contact-holding structure includes first, second, and third sections 219a, 219b and 219c that assemble together with pins 219d and 219e to hold four springs 201, 202, 203, and 204. Each of the four springs bears against various ones of twelve blades, and the blades are insulated by insulator members 206a through 206m. The twelve blades pivot about a nonconductive sleeve 207 that is assembled coaxially over the pin 219d. When assembled, the second and third sections 219b and 219c of the contact-holding structure form a female connector 250 similar to the female connector 150 of the contactor assembly 100. Apart from those similarities, the first section 219a of the contact-holding structure includes differently configured protrusions 251 and 252 that engage mating structure on a testing machine for alignment purposes.

Figure 13:
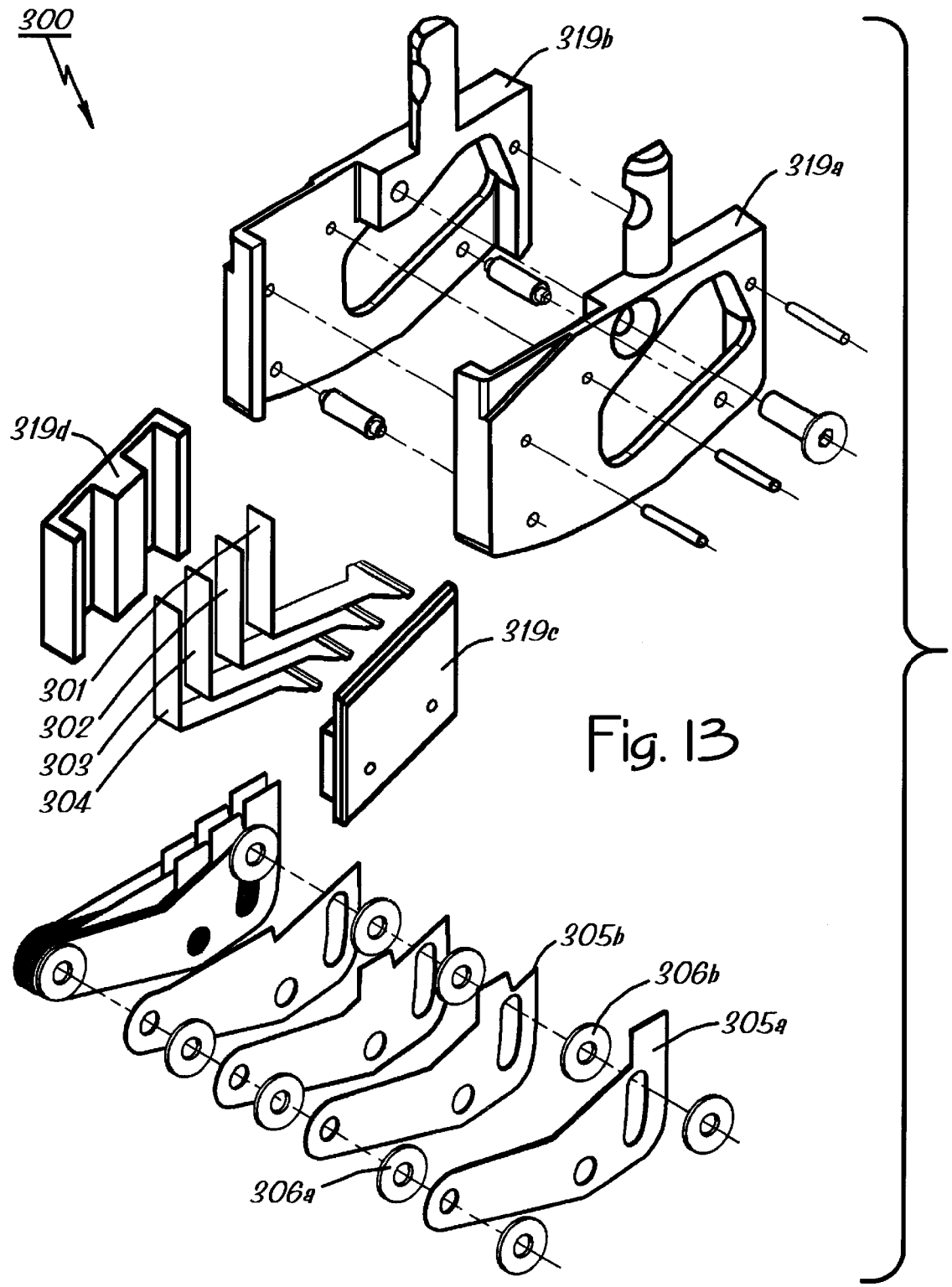
FIG. 13 is an exploded view of a four-spring, twelve-blade, fourth embodiment having different insulators intermediate the blades.

Turning now to FIG. 13, it shows a fourth embodiment in the form of a four-spring, twelve-blade, contactor assembly 300. The contactor assembly 300 is similar in structure and function to the contactor assembly 200. The primary difference is a different insulator arrangement. For convenience, reference numerals designating parts of the contactor assembly 300 are increased by one hundred over those designating similar or related parts of the contactor assembly 200.

Similar to the contactor assembly 200, the contactor assembly 300 includes a contact-holding structure for holding a plurality of at least three contacts (twelve blade-type contacts) on the testing system 32 shown in FIG. 4. The contact-holding structure is a little different than that of the contactor assembly 200, including first, second, third, fourth sections 319a, 319b, 319c, and 319d that assemble together. The components 319c and 319d of the contact-holding structure hold four springs 301, 302, 303, and 304 in position to bear against and thereby spring bias various ones of twelve blades, just two blades 305 and 306 being identified in FIG. 13.

The blades are insulated by insulator members, of which just two insulators 306a and 306b are identified in FIG. 13. Unlike the insulators of the contactor assembly 200, the insulators of the contactor assembly 300 (including the insulators 306a and 306b) are circularly shaped, washer-like components of a suitable, electrically nonconducting composition. Pairs of the insulators are provided between adjacent blades and between the outermost blades and the components 319a and 319b of the contact-holding structure for the added blade stability thereby achieved, as indicated by the pair of insulators 306a and 306b between the blades 305a and 305b. Thickness of the insulators can be chosen to achieve a desired spacing between blades for specific applications (e.g., contacting multiple terminals on an array component).

FIGS. 14a–14e show details of a fifth embodiment in the form of a roller-type contactor assembly 400. The contactor assembly 400 is similar in many respects to the contactor assembly 300, the primary difference being rollers on the blades that convert a sliding-type contactor (e.g., the contactor assembly 300) to the roller-type contactor assembly 400. For convenience, reference numerals designating parts of the contactor assembly 400 are increased by one hundred over those designating similar or related parts of the contactor assembly 300.

Figures 14A, 14B, 14C:
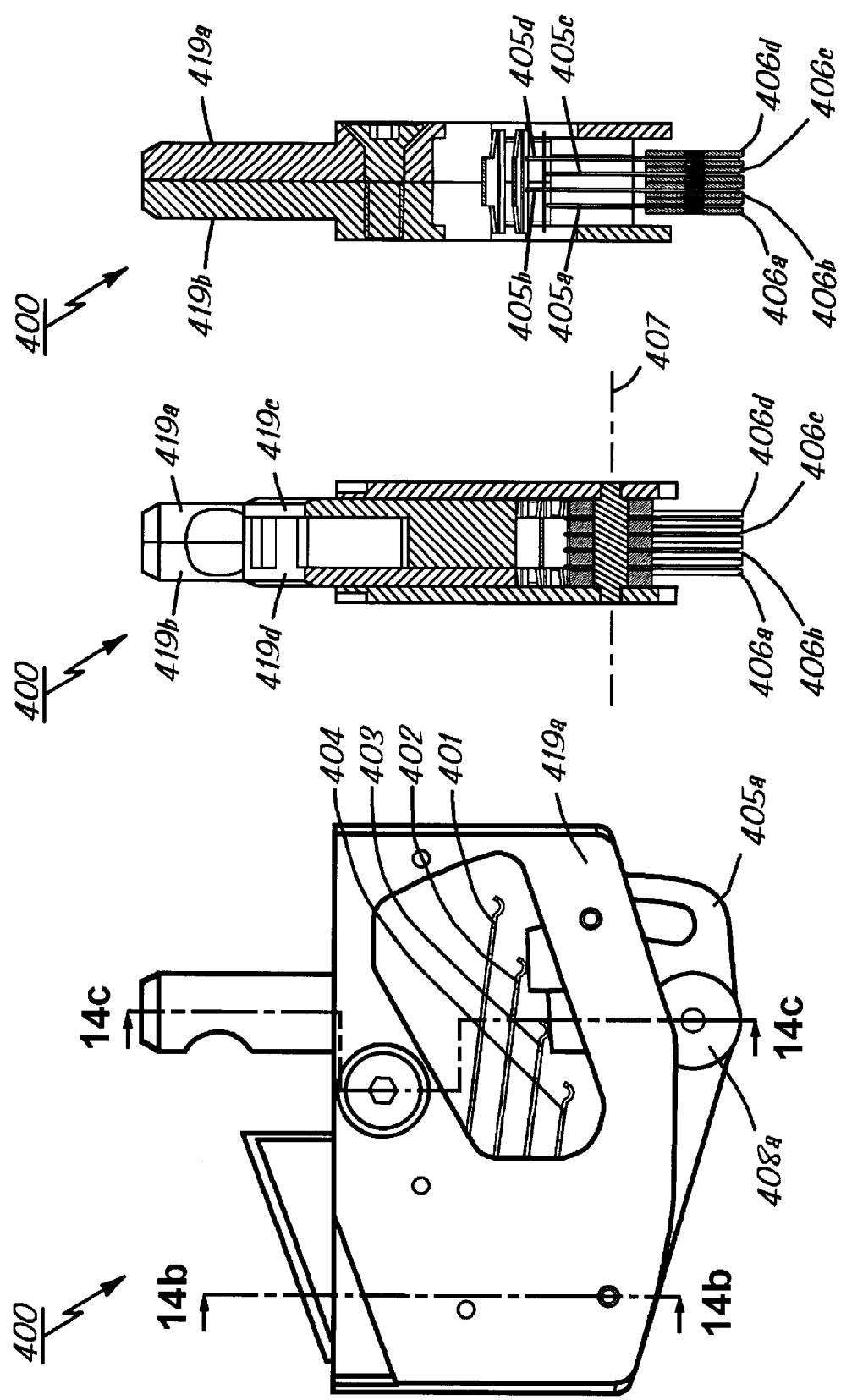

Similar to the contactor assembly 300, the contactor assembly 400 includes a combination of contact-holding structure components 419a, 419b, 419c, and 419d that assemble together to form a contact-holding structure for holding four electrically conductive springs 401, 402, 403, and 404 and four electrically conductive contacts (FIGS. 14a, 14b, and 14c). The four contacts take the form of roller-blade contact assemblies 406a, 406b, 406c, and 406d mounted for a small amount of pivotal movement about a pivotal axis 407 (FIG. 14b). The spring 402 bears against blades 405a and 405c (FIG. 14c) to spring bias the roller-blade assemblies 406a and 406c toward a DUT terminal (e.g., the DUT terminal 29 in FIG. 4), while the spring 403 bears against blades 405b and 405d to spring bias the roller-blade assemblies 405b and 405d. The springs 401 and 404 are unused and can be omitted from the contactor assembly 400 for the roller-blade arrangement illustrated in FIGS. 14a–14e.

Figure 14E:
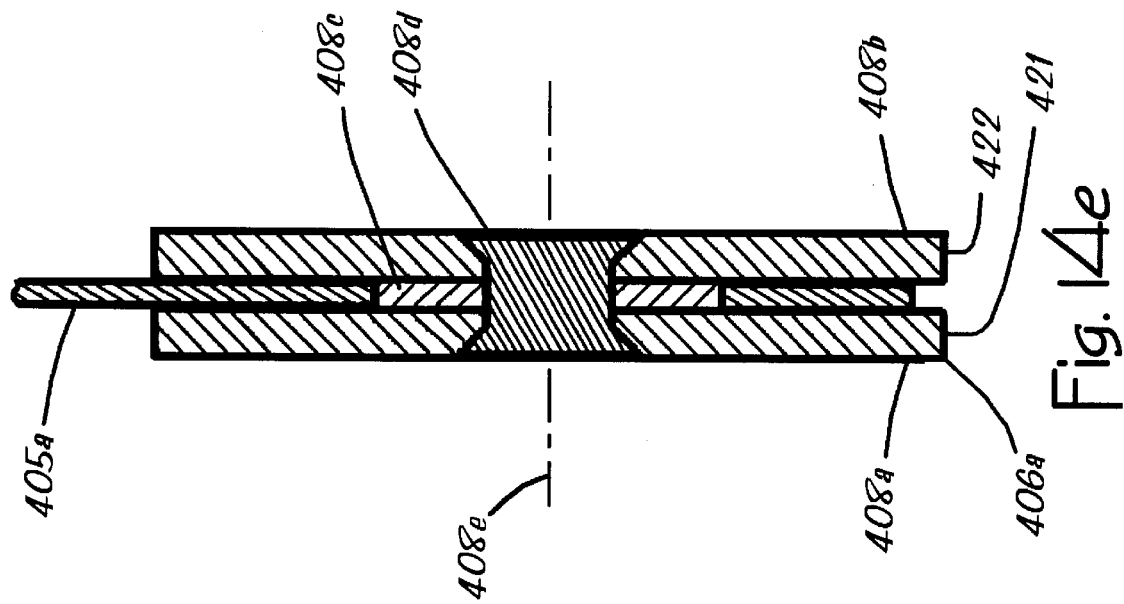
FIG. 14e is a further enlarged cross sectional view of the roller assembly as viewed in a vertical plane containing a line 14e—14e in FIG. 14d.
Figure 14D:
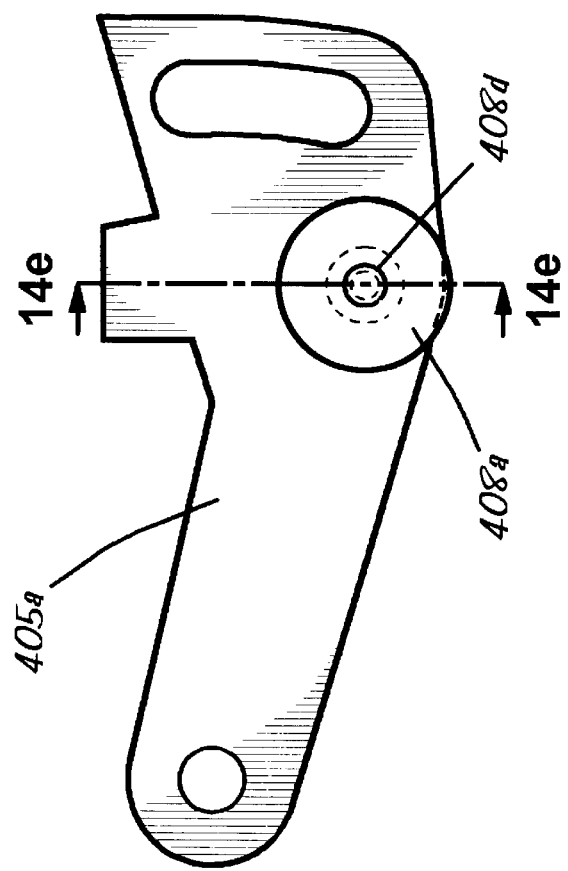
FIG. 14d is an enlarged side elevation view of a contact blade and roller assembly of the roller-type fifth embodiment.
Figure 15B:
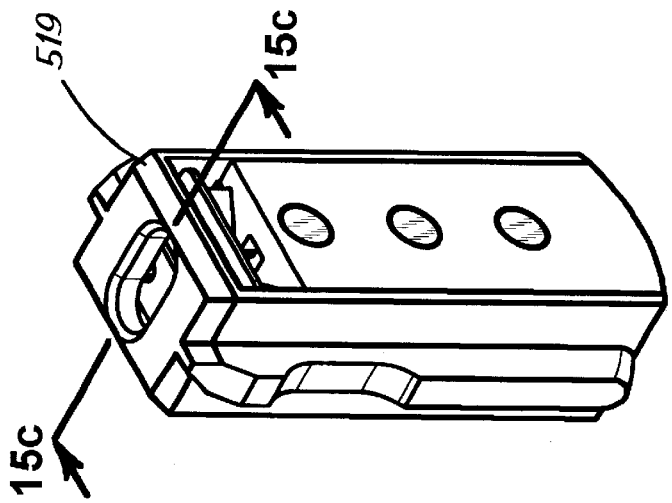
FIG. 15b is an isometric view of the pogo-pin sixth embodiment.
Figure 15A:
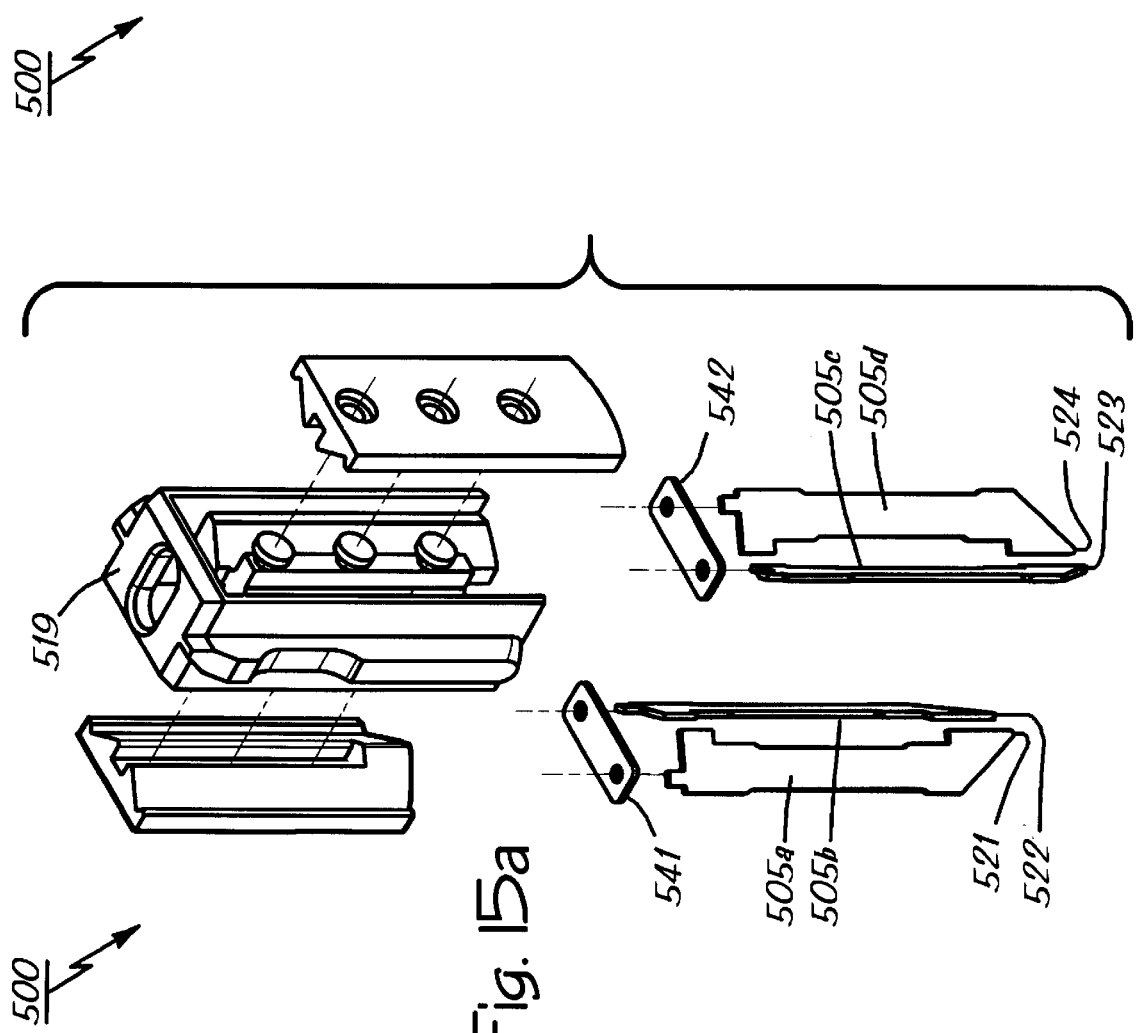
FIG. 15a is an exploded view of a pogo-pin sixth embodiment of a contactor assembly constructed according to the invention.

The roller-blade contact assemblies 406a–406d are generally similar and so details of just the roller-blade contact assembly 406a are described in further detail with reference to FIGS. 14d and 14e. The roller-blade assembly 406a includes two electrically conductive rollers 408a and 408b (e.g., bronze beryllium) that are mounted on the blade 405a (e.g., also bronze beryllium) with a mounting member 408c and an axle member 408d for rotation about a rotational axis 408e. As the outer circumferences 421 and 422 of the rollers 408a and 408b (FIG. 14e) contact a passing DUT terminal (e.g., the DUT terminal 29 in FIG. 4), the rollers 408a and 408b rotate about the rotational axis 408e so that they roll across the DUT terminal instead of sliding across it. The outer circumferences 421 and 422 are forward edges of the roller-blade assembly 406a, counterparts of the forwarded edges 21–28 identified in FIG. 4 for the contactor assembly 10 and the forward edges 105a–105l identified in FIG. 11 for the contactor assembly 100.

FIGS. 15a–15f show details of a sixth embodiment in the form of a pogo-type contactor assembly 500. The contactor assembly 500 is similar in some respects to the contactor assemblies already described, the primary difference being pogo-pin blades. Reference numerals are in the five hundreds.

The contactor assembly 500 includes a contact-holding structure 519 that holds four electrically conductive pogo-pin blades 505a, 505b, 505c, and 505d. The pogo-pin blades 505a and 505b are connected together with an electrically conductive strap 541 (FIG. 15c) while the pogo-pin blades 505c and 505d are connected together with an electrically conductive strap 542. The pogo-pin blades 505a–505d are held moveably by the contact-support structure 519 so that forwarded edges 521, 522, 523, and 524 identified in FIGS. 15a, 15c, 15d, and 15g are moveable toward and away from a DUT terminal (e.g., the DUT terminal 29 in FIG. 4). Suitable spring biasing components represented by an arrow 551 in FIG. 15c spring biases the pogo-pin blades 505a and 505b with constant force toward the DUT terminal, while other spring biasing components represented by an arrow 552 in FIG. 15c spring biases the pogo-pin blades 505c and 505d toward the DUT terminal. The force varies over the range of travel of the blades less than ten percent of its maximum value. Electrical connection to the pogo-pin blades is made with the spring biasing components.

Thus, the invention provides a contactor assembly having at least three independently moveable contacts in side-by-side relationship that are spring biased toward the DUT terminal. Three contacts help insure that at least two of them contact the DUT terminal for lower stray serial impedance (SSI). A preferred embodiment accomplishes spring biasing with constant force over a normal range of travel to alleviate scratching concerns. Sliding contacts in the form of thin side-by-side blades having forward edges disposed toward the DUT terminal further facilitate multiple contacts. Insulation between contacts isolates the contacts from each other to enable Kelvin measurement techniques, including insulated measurement circuits with several contacts at the same potential (e.g., Kelvin and/or guarded circuits). An intermediate one of the three contacts may be held at a guard potential in order to help balance leakage currents. The number of blades can be increased beyond three so that they can better conform to the shape of the DUT terminal, and a controlled impedance can be placed between drive and sense contacts so that a test circuit works even if one of the contacts fail. In addition, direct replacement of an existing contactor assembly with a multi-contact, constant-force contact assembly constructed according to the invention significantly improves performance. Moreover, the technology is adaptable to any of various terminal contacting applications, including contacting a street car power line, contacting the terminals on a rechargeable battery, and so forth. Although exemplary embodiments have been shown and described, one of ordinary skill in the art may make many changes, modifications, and substitutions without necessarily departing from the spirit and scope of the invention.

What is claimed is:

1. A contactor assembly useable on a component testing system for electrically contacting a terminal on a DUT as the component testing system moves the DUT past the contactor assembly, the contactor assembly comprising:

at least three contacts having forward edges for physically and electrically contacting the terminal on the DUT as the component testing system moves the DUT past the contactor assembly, including a first contact having a first forward edge, a second contact having a second forward edge, and a third contact having a third forward edge;

a contact-holding structure mountable on the component testing system for supporting the contacts in side-by-side relationship for independent movement of the first, second, and third forward edges toward and away from the terminal on the DUT as the DUT moves past the contactor assembly; and means for spring biasing the first, second, and third forward edges toward the terminal on the DUT;

wherein the means for spring biasing the first, second, and third forward edges toward the terminal on the DUT includes at lest two springs;

wherein a first spring of the at least two springs is arranged to spring bias at least one of the first and third forward edges toward the terminal on the DUT independent of the second forward edge; and wherein a second spring of the at least two springs is arranged to spring bias the second forward edge toward the terminal on the DUT independent of the first and third forward edges.

2. A contactor assembly as recited in claim 1, wherein the means for independently spring biasing each of the first, second, and third forward edges toward the terminal on the DUT includes first and second leaf springs arranged to spring bias the first, second, and third forward edges with constant force over a normal range of travel of the forward edges.

3. A contactor assembly as recited in claim 1, wherein the first, second, and third contacts have a combined width less that a width characteristic of the terminal on the DUT.

4. A contactor assembly as recited in claim 1, further comprising means for electrically insulating the contacts from each other.

5. A contactor assembly as recited in claim 4, wherein the means for electrically insulating the contacts from each other includes a nonconductive coating on at least some of the contacts.

6. A contactor assembly as recited in claim 4, wherein the means for electrically insulating the contacts from each other includes at least first and second insulating members, the first insulating member being disposed intermediate the first and second contacts and the second insulating member being disposed intermediate the second and third contacts.

7. A contactor assembly as recited in claim 1, wherein the first, second, and third contacts are sliding contacts.

8. A contactor assembly as recited in claim 1, wherein the first second, and third contacts are rolling contacts.

9. A contactor assembly as recited in claim 1, wherein the first second, and third contacts are pogo contacts.

10. A contactor assembly as recited in claim 1, wherein the contact-holding structure is composed of an electrically non-conductive material.

11. A contactor assembly as recited in claim 1, wherein the contact-holding structure is composed of an electrically conductive material.

12. A contactor assembly for electrically contacting a terminal, comprising:

at least three contacts having forward edges for physically and electrically contacting the terminal, including a first contact having a first forward edge, a second contact having a second forward edge, and a third contact having a third forward edge;

means for supporting the contacts in side-by-side relationship for independent movement of the first, second, and third forward edges toward and away from the terminal; and means for spring biasing the first, second, and third forward edges toward the terminal;

wherein the means for spring biasing the first, second, and third forward edges toward the terminal includes at least two springs;

wherein a first spring of the at least two springs is arranged to spring bias at least one of the first and third forward edges toward the terminal independent of the second forward edge; and wherein a second spring of the at least two springs is arranged to spring bias the second forward edge toward the terminal independent of the first and third forward edges.

* * * * *